United States Patent
Kanemoto

(10) Patent No.: US 7,294,539 B2
(45) Date of Patent: Nov. 13, 2007

(54) SEMICONDUCTOR SUBSTRATE, SEMICONDUCTOR DEVICE, METHOD OF MANUFACTURING SEMICONDUCTOR SUBSTRATE, AND METHOD OF MANUFACTURING SEMICONDUCTOR DEVICE

(75) Inventor: Kei Kanemoto, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 63 days.

(21) Appl. No.: 11/393,213

(22) Filed: Mar. 29, 2006

(65) Prior Publication Data

US 2006/0220132 A1    Oct. 5, 2006

(30) Foreign Application Priority Data

Mar. 29, 2005    (JP) .............................. 2005-094368

(51) Int. Cl.
*H01L 21/00* (2006.01)
*H01L 21/84* (2006.01)

(52) U.S. Cl. .......................... 438/166; 438/486; 117/8; 257/E21.133

(58) Field of Classification Search ................ 438/166, 438/486; 117/8; 257/E21.133
See application file for complete search history.

(56) References Cited

U.S. PATENT DOCUMENTS

| 6,919,238 B2* | 7/2005 | Bohr ........................... 438/166 |
| 2003/0113961 A1* | 6/2003 | Horiuchi et al. ............. 438/157 |
| 2004/0048454 A1* | 3/2004 | Sakaguchi ................... 438/486 |

FOREIGN PATENT DOCUMENTS

| JP | 09-266170 | 10/1997 |
| JP | 2000-124092 | 4/2000 |
| JP | 2002-299591 | 10/2002 |

* cited by examiner

*Primary Examiner*—George Fourson
*Assistant Examiner*—John M. Parker
(74) *Attorney, Agent, or Firm*—John J. Penny, Jr.; Edwards Angell Palmer & Dodge LLP

(57) ABSTRACT

A method of manufacturing a semiconductor device, includes: forming an insulating layer on a single crystal semiconductor substrate; forming a non-crystalline semiconductor layer on the insulating layer; forming an insulating film on the non-crystalline semiconductor layer; forming an opening section for exposing a part of a surface of the single crystal semiconductor substrate through the insulating film, the non-crystalline semiconductor layer and the insulating layer; forming a single crystal semiconductor layer embedded in the opening section so as to have contact with the non-crystalline semiconductor layer; removing the insulating film and the insulating layer while the single crystal semiconductor layer supporting the non-crystalline semiconductor layer above the single crystal semiconductor substrate; forming a single-crystallized semiconductor layer obtained by single-crystallizing the non-crystalline semiconductor layer using the single crystal semiconductor layer as a seed by providing a thermal treatment on the non-crystalline semiconductor layer from which the insulating film and the insulating layer are removed; filling a gap between the single-crystallized semiconductor layer and the single crystal semiconductor substrate with an embedded insulating layer; forming a gate electrode on the single-crystallized semiconductor layer; and forming in the single-crystallized semiconductor layer a source layer disposed on one side of the gate electrode and a drain layer disposed on the other side of the gate electrode.

4 Claims, 9 Drawing Sheets

SEMICONDUCTOR SUBSTRATE, SEMICONDUCTOR DEVICE, METHOD OF MANUFACTURING SEMICONDUCTOR SUBSTRATE, AND METHOD OF MANUFACTURING SEMICONDUCTOR DEVICE

BACKGROUND OF THE INVENTION

1. Technical Field

The invention relates to a semiconductor substrate, a semiconductor device, a method of manufacturing a semiconductor substrate, and a method of manufacturing a semiconductor device, and is particularly suitable for application to a field effect transistor formed on an SOI (Silicon On Insulator) substrate.

2. Related Art

A field effect transistor formed on an SOI substrate has availability drawing attention in view of its easiness in element separation, latch-up free, small source-drain junction capacitance. In particular, since a complete depletion type SOI transistor can offer low power consumption and high operation speed and is easy to be driven with a low voltage, researches for making the SOI transistor in the complete depletion mode are actively conducted. Here, as the SOI substrate, for example, an SIMOX (Separation by Implanted Oxygen) substrate or a laminated substrate is used as disclosed in JP-A-2002-299591 or JP-A-2000-124092.

Further, JP-A-9-266170 discloses a method of forming an SOI structure on a bulk wafer. According to the method disclosed in the document, an oxide film is formed on a single crystal silicon substrate, and then an opening is provided in the oxide film to expose the single crystal silicon to form the base, and after then, an amorphous silicon layer is formed on the entire surface. And, the amorphous silicon layer on the oxide film is single-crystallized by the lateral solid-phase epitaxial growth using the single crystal silicon exposed through the opening as a seed crystal.

However, in order for manufacturing the SIMOX substrate, it is required to ion-implant oxygen to the silicon wafer in high concentration. Further, in order for manufacturing the laminated substrate, it is required to bond two silicon wafers with each other and then polish a surface of the silicon wafer. Therefore, the SOI transistors problematically incur higher cost in comparison with field effect transistors formed on bulk semiconductors.

Further, the ion-implantation process or the polishing process causes large variation in the thickness of the SOI layer. Therefore, if the SOI layer is made thinner for forming the complete depletion type of SOI transistor, it is problematically difficult to stabilize the characteristics of the field effect transistor.

Further, according to the method disclosed in JP-A-9-266170 described above, the amorphous silicon layer is single-crystallized while contacting the oxide film. Accordingly, the lateral single crystallization of the amorphous silicon layer is constricted by the oxide film to cause degradation of crystal quality of the single crystal semiconductor layer, and also it is problematically difficult to obtain a large sized single crystal semiconductor layer.

SUMMARY

Therefore, an advantage of the invention is to provide a semiconductor substrate, a semiconductor device, a method of manufacturing a semiconductor substrate, and a method of manufacturing a semiconductor device each capable of forming a single crystal semiconductor layer on an insulating member at low cost while improving the crystal quality of the single crystal semiconductor layer.

In order for obtaining the advantage described above, a semiconductor substrate according to an aspect of the invention includes a single-crystallized semiconductor layer single-crystallized while being supported above a single crystal semiconductor substrate via a seed crystal and an embedded insulating layer embedded between the single-crystallized semiconductor layer and the single crystal semiconductor substrate.

Thus, the single-crystallized semiconductor layer can be formed by the thermal treatment on the non-crystalline semiconductor layer via the seed crystal while the non-crystalline semiconductor layer is held above the single crystal semiconductor substrate so that the non-crystalline semiconductor layer does not have contact with the oxide film. Therefore, the lateral single crystallization of the non-crystalline semiconductor layer can be prevented from being constricted by the oxide film, thus the single-crystallized semiconductor layer can be formed on the insulating member at low cost while improving the crystal quality of the single-crystallized semiconductor layer, and further a large sized single-crystallized semiconductor layer can be obtained.

Further, a semiconductor device according to another aspect of the invention includes a single-crystallized semiconductor layer single-crystallized while being held above the single crystal semiconductor substrate via a seed crystal, an embedded insulating layer embedded between the single-crystallized semiconductor layer and the single crystal semiconductor substrate, a gate electrode disposed on at least one of the single-crystallized semiconductor layer and a side wall of the single-crystallized semiconductor layer, a source layer formed in the single-crystallized semiconductor layer and disposed on one side of the gate electrode, a drain layer formed in the single-crystallized semiconductor layer and disposed on the other side of the gate electrode.

Accordingly, the single crystallization of the non-crystalline semiconductor layer can be proceeded while preventing the lateral single crystallization of the non-crystalline semiconductor layer from being constricted by the oxide film, thus the single-crystallized semiconductor layer can be formed on the insulating member at low cost while improving the crystal quality of the single-crystallized semiconductor layer, and further a large sized single-crystallized semiconductor layer can be obtained.

Further, a method of manufacturing a semiconductor substrate according to another aspect of the invention includes the step of forming an insulating layer on a single crystal semiconductor substrate, the step of forming a non-crystalline semiconductor layer on the insulating layer, the step of forming an insulating film on the non-crystalline semiconductor layer, the step of forming an opening section for exposing a part of a surface of the single crystal semiconductor substrate through the insulating film, the non-crystalline semiconductor layer and the insulating layer, the step of forming a single crystal semiconductor layer embedded in the opening section so as to have contact with the non-crystalline semiconductor layer, the step of removing the insulating film and the insulating layer while the single crystal semiconductor layer supporting the non-crystalline semiconductor layer above the single crystal semiconductor substrate, the step of forming a single-crystallized semiconductor layer obtained by single-crystallizing the non-crystalline semiconductor layer using the single crystal semiconductor layer as a seed by providing a thermal treatment on the non-crystalline semiconductor layer from which the insulating film and the insulating layer are removed, and the step of filling a gap between the single-crystallized semiconductor layer and the single crystal semiconductor substrate with an embedded insulating layer.

Thus, the non-crystalline semiconductor layer can be supported by the single crystal layer above the single crystal semiconductor substrate, and the non-crystalline semiconductor layer can be held above the single crystal semiconductor substrate with a distance while the non-crystalline semiconductor layer has contact only with the single crystal semiconductor layer. Accordingly, the single-crystallized semiconductor layer can be formed by the thermal treatment on the non-crystalline semiconductor layer via the seed crystal while the non-crystalline semiconductor layer is held above the single crystal semiconductor substrate so that the non-crystalline semiconductor layer does not have contact with the insulating layer. Therefore, the single-crystallized semiconductor layer can be formed while preventing the lateral single crystallization of the non-crystalline semiconductor layer from being constricted by the oxide film, and at the same time, an insulating layer can be disposed between the single-crystallized semiconductor layer and the single crystal semiconductor substrate. As a result, the single-crystallized semiconductor layer can be formed on the insulating member at low cost while improving the crystal quality of the single-crystallized semiconductor layer, and a large sized single-crystallized semiconductor layer can also be realized.

Further, a method of manufacturing a semiconductor substrate according to another aspect of the invention includes the step of forming an insulating layer on a single crystal semiconductor substrate, the step of forming an opening section for exposing a part of a surface of the single crystal semiconductor substrate through the insulating layer, the step of forming on the insulating layer a non-crystalline semiconductor layer disposed so as to have contact with the single crystal semiconductor substrate via the opening section, the step of removing the insulating layer while a part of the non-crystalline semiconductor layer embedded in the opening section supporting a part of the non-crystalline semiconductor layer disposed on the insulating layer above the single crystal semiconductor substrate, the step of forming a single-crystallized semiconductor layer obtained by single-crystallizing the non-crystalline semiconductor layer using the single crystal semiconductor substrate as a seed by providing a thermal treatment on the non-crystalline semiconductor layer from which the insulating layer is removed, and the step of filling a gap between the single-crystallized semiconductor layer and the single crystal semiconductor substrate with an embedded insulating layer.

Thus, the single-crystallized semiconductor layer can be formed by the thermal treatment on the non-crystalline semiconductor layer via the seed crystal while the non-crystalline semiconductor layer is held above the single crystal semiconductor substrate by itself so that the non-crystalline semiconductor layer does not have contact with the insulating layer. Therefore, without using the selective epitaxial growth, the lateral single crystallization of the non-crystalline semiconductor layer can be prevented from being constricted by the oxide film, and at the same time, an insulating layer can be disposed between the single-crystallized semiconductor layer and the single crystal semiconductor substrate. As a result, a large sized single-crystallized semiconductor layer can be realized while preventing the manufacturing process from becoming complicated, and the single-crystallized semiconductor layer can be formed on the insulating member at low cost.

Further, a method of manufacturing a semiconductor device according to another aspect of the invention includes the step of forming an insulating layer on a single crystal semiconductor substrate, the step of forming a non-crystalline semiconductor layer on the insulating layer, the step of forming an insulating film on the non-crystalline semiconductor layer, the step of forming an opening section for exposing a part of a surface of the single crystal semiconductor substrate through the insulating film, the non-crystalline semiconductor layer and the insulating layer, the step of forming a single crystal semiconductor layer embedded in the opening section so as to have contact with the non-crystalline semiconductor layer, the step of removing the insulating film and the insulating layer while the single crystal semiconductor layer supporting the non-crystalline semiconductor layer above the single crystal semiconductor substrate, the step of forming a single-crystallized semiconductor layer obtained by single-crystallizing the non-crystalline semiconductor layer using the single crystal semiconductor layer as a seed by providing a thermal treatment on the non-crystalline semiconductor layer from which the insulating film and the insulating layer are removed, the step of filling a gap between the single-crystallized semiconductor layer and the single crystal semiconductor substrate with an embedded insulating layer, the step of forming a gate electrode on the single-crystallized semiconductor layer, and the step of forming in the single-crystallized semiconductor layer a source layer disposed on one side of the gate electrode and a drain layer disposed on the other side of the gate electrode.

Thus, the single-crystallized semiconductor layer can be formed by the thermal treatment on the non-crystalline semiconductor layer via the seed crystal while the non-crystalline semiconductor layer is held by the single crystal semiconductor layer above the single crystal semiconductor substrate so that the non-crystalline semiconductor layer does not have contact with the insulating layer. Therefore, the SOI transistor can be formed without using any SOI substrates, and further the single-crystallized semiconductor layer with large area can be obtained while improving the crystal quality of the single-crystallized semiconductor layer, thus price-reduction and quality-improvement of the SOI transistor can be achieved.

Further, a method of manufacturing a semiconductor device according to another aspect of the invention includes the step of forming an insulating layer on a single crystal semiconductor substrate, the step of forming an opening section for exposing a part of a surface of the single crystal semiconductor substrate through the insulating layer, the step of forming on the insulating layer a non-crystalline semiconductor layer disposed so as to have contact with the single crystal semiconductor substrate via the opening section, the step of removing the insulating layer while a part of the non-crystalline semiconductor layer embedded in the opening section supporting a part of the non-crystalline semiconductor layer disposed on the insulating layer above the single crystal semiconductor substrate, the step of forming a single-crystallized semiconductor layer obtained by single-crystallizing the non-crystalline semiconductor layer using the single crystal semiconductor substrate as a seed by providing a thermal treatment on the non-crystalline semiconductor layer from which the insulating layer is removed, the step of filing a gap between the single-crystallized semiconductor layer and the single crystal semiconductor substrate with an embedded insulating layer, the step of forming a gate electrode on the single-crystallized semiconductor layer, and the step of forming in the single-crystallized semiconductor layer a source layer disposed on one side of the gate electrode and a drain layer disposed on the other side of the gate electrode.

Thus, the single-crystallized semiconductor layer can be formed by the thermal treatment on the non-crystalline semiconductor layer via the seed crystal while the non-crystalline semiconductor layer is held above the single crystal semiconductor substrate by itself so that the non-crystalline semiconductor layer does not have contact with the insulating layer. Therefore, the SOI transistor can be formed without using the SOI substrate, and further the single-crystallized semiconductor layer with large area can be obtained without using the selective epitaxial growth, thus price-reduction and quality-improvement of the SOI transistor can be achieved.

Further, a method of manufacturing a semiconductor device according to another aspect of the invention includes the step of forming an insulating layer on a single crystal semiconductor substrate, the step of forming a non-crystalline semiconductor layer on the insulating layer, the step of patterning the non-crystalline semiconductor layer so that the non-crystalline semiconductor layer has a fin-like shape, the step of forming an insulating film on the non-crystalline semiconductor layer patterned to have the fin-like shape, the step of forming an opening section for exposing a part of a surface of the single crystal semiconductor substrate through the insulating film, the non-crystalline semiconductor layer and the insulating layer, the step of forming a single crystal semiconductor layer embedded in the opening section so as to have contact with the non-crystalline semiconductor layer, the step of removing the insulating film and the insulating layer while the single crystal semiconductor layer supporting the non-crystalline semiconductor layer above the single crystal semiconductor substrate, the step of forming a single-crystallized semiconductor layer obtained by single-crystallizing the non-crystalline semiconductor layer using the single crystal semiconductor layer as a seed by providing a thermal treatment on the non-crystalline semiconductor layer from which the insulating film and the insulating layer are removed, the step of filling a gap between the single-crystallized semiconductor layer and the single crystal semiconductor substrate with an embedded insulating layer, the step of forming a gate electrode on a side wall of the single-crystallized semiconductor layer, and the step of forming in the single-crystallized semiconductor layer a source layer disposed on one side of the gate electrode and a drain layer disposed on the other side of the gate electrode.

Thus, the single-crystallized semiconductor layer having a fin-like shape can be formed by the thermal treatment on the non-crystalline semiconductor layer via the seed crystal while the non-crystalline semiconductor layer is held above the single crystal semiconductor substrate so that the non-crystalline semiconductor layer does not have contact with the insulating layer. Therefore, the SOI transistor can be formed without using the SOI substrate, and the drive capacity of the SOI transistor can be increased without increasing the element size, thus high-density integration of the SOI transistor can be realized while achieving price-reduction and quality-improvement of the SOI transistor.

Further, a method of manufacturing a semiconductor device according to another aspect of the invention includes the step of forming an insulating layer on a single crystal semiconductor substrate, the step of forming an opening section for exposing a part of a surface of the single crystal semiconductor substrate through the insulating layer, the step of forming on the insulating layer a non-crystalline semiconductor layer disposed so as to have contact with the single crystal semiconductor substrate via the opening section, the step of patterning the non-crystalline semiconductor layer so that the non-crystalline semiconductor layer has a fin-like shape, the step of removing the insulating layer while a part of the non-crystalline semiconductor layer embedded in the opening section supporting a part of the non-crystalline semiconductor layer disposed on the insulating layer above the single crystal semiconductor substrate, the step of forming a single-crystallized semiconductor layer obtained by single-crystallizing the non-crystalline semiconductor layer using the single crystal semiconductor substrate as a seed by providing a thermal treatment on the non-crystalline semiconductor layer from which the insulating layer is removed, the step of filling a gap between the single-crystallized semiconductor layer and the single crystal semiconductor substrate with an embedded insulating layer, the step of forming a gate electrode on a side wall of the single-crystallized semiconductor layer, and the step of forming in the single-crystallized semiconductor layer a source layer disposed on one side of the gate electrode and a drain layer disposed on the other side of the gate electrode.

Accordingly, the single-crystallized semiconductor layer having a fin-like shape can be formed by the thermal treatment on the non-crystalline semiconductor layer via the seed crystal while the non-crystalline semiconductor layer is held above the single crystal semiconductor substrate so that the non-crystalline semiconductor layer does not have contact with the insulating layer, and further, the selective epitaxial growth for forming the seed crystal can be eliminated, thus simplification of the manufacturing process can be achieved. Therefore, the SOI transistor can be formed without using the SOI substrate, and the drive capacity of the SOI transistor can be increased without increasing the element size, thus high-density integration of the SOI transistor can be realized while achieving price-reduction and quality-improvement of the SOI transistor.

Further, a method of manufacturing a semiconductor device according to another aspect of the invention includes the step of forming in the single-crystallized semiconductor layer a groove disposed so as to include the opening section, and the step of filling in the groove with an insulating member.

Accordingly, the single-crystallized semiconductor layer can be separated from the seed crystal while achieving separation of elements of the single-crystallized semiconductor layer disposed on the embedded insulating layer, thus the single-crystallized semiconductor layer can completely be insulated from the single crystal semiconductor substrate while preventing the manufacturing process from becoming complicated.

BRIEF DESCRIPTION OF THE DRAWINGS

The invention will now be described with reference to the accompanying drawings, wherein like numbers refer to like elements.

DESCRIPTION OF THE EMBODIMENTS

A method of manufacturing a semiconductor device according to an embodiment of the present invention is hereinafter described with reference to the accompanying drawings.

FIGS. 1 through 8 are perspective views showing the method of manufacturing a semiconductor device according to the first embodiment of the invention.

Figure 1:
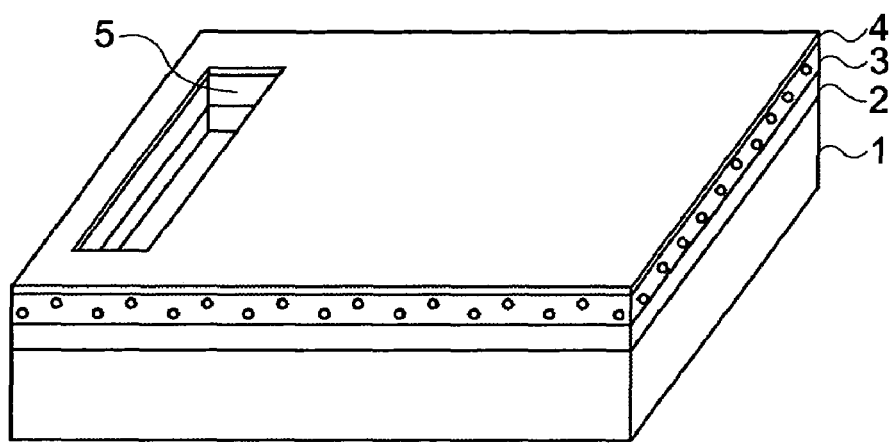
FIG. 1 is a perspective view showing a method of manufacturing a semiconductor device according to a first embodiment of the invention.

In FIG. 1, a silicon oxide film 2, a non-crystalline semiconductor layer 3, and a silicon oxide film 4 are sequentially formed on a single crystal semiconductor substrate 1 by a CVD process or the like. And then, by patterning the silicon oxide film 2, the non-crystalline semiconductor layer 3, and the silicon oxide film 4 using a photolithography technology and an etching technology, an opening section 5 for exposing a part of the surface of the single crystal semiconductor substrate 1 through the silicon oxide film 2, the non-crystalline semiconductor layer 3 and the silicon oxide film 4 is formed. Note that as a material for the single crystal semiconductor substrate 1 and the non-crystalline semiconductor layer 3, for example, Si, Ge, SiGe, SiC, SiSn, PbS, GaAs, InP, GaP, GaN, ZnSe or the like can be used. Further, in order for exposing a part of the single crystal semiconductor substrate, the etching can be stopped on the surface of the single crystal semiconductor substrate 1, or the single crystal semiconductor substrate 1 can be overetched to form a recess section on the single crystal semiconductor substrate 1. Further, the position of the opening section 5 can correspond to a part of an element isolation region of the single crystal semiconductor substrate 1.

Figure 2:
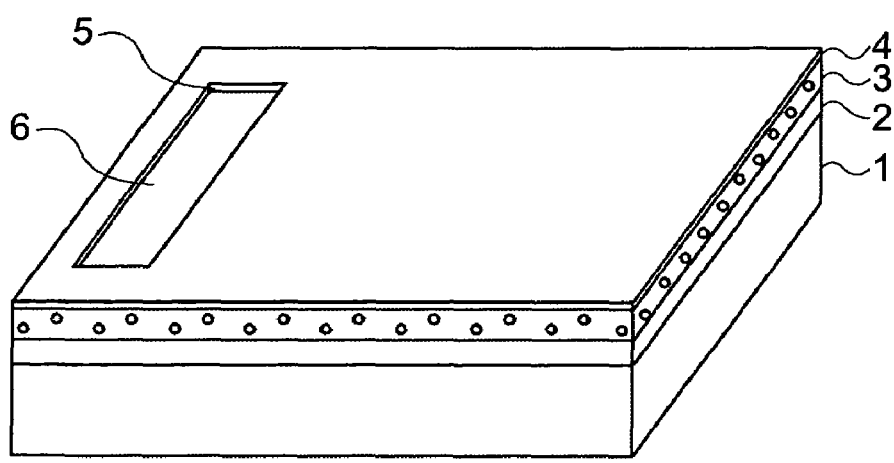
FIG. 2 is a perspective view showing the method of manufacturing a semiconductor device according to the first embodiment of the invention.

Subsequently, as shown in FIG. 2, a single crystal semiconductor layer 6 embedded in the opening section 5 so as to contact the non-crystalline semiconductor layer 3 is formed by conducting the selective epitaxial growth. Note that as a material for the single crystal semiconductor layer 6, for example, Si, Ge, SiGe, SiC, SiSn, PbS, GaAs, InP, GaP, GaN, ZnSe or the like can be used, and the same material as those of the single crystal semiconductor substrate 1 and the non-crystalline semiconductor layer 3 is preferably used.

Here, in the selective epitaxial growth, the single crystal semiconductor layer 6 is formed on the single crystal semiconductor substrate 1 by a thermal CVD while supplying a material gas for forming the single crystal semiconductor layer 6. In this case, although a layer of polycrystal semiconductor or non-crystalline semiconductor is formed on the oxide film 4 while the single crystal semiconductor layer 6 is formed on the single crystal semiconductor substrate 1, by exposing the layer of non-crystalline semiconductor or the like to a chlorine gas or the like, the layer of non-crystalline semiconductor or the like on the oxide film 4 can be decomposed to be removed while keeping the single crystal semiconductor layer 6 formed on the single crystal semiconductor substrate 1. Therefore, the single crystal semiconductor layer 6 can be formed only on the part of the single crystal semiconductor substrate 1 exposed through the opening section 5 by conducting the selective epitaxial growth.

Figure 3:
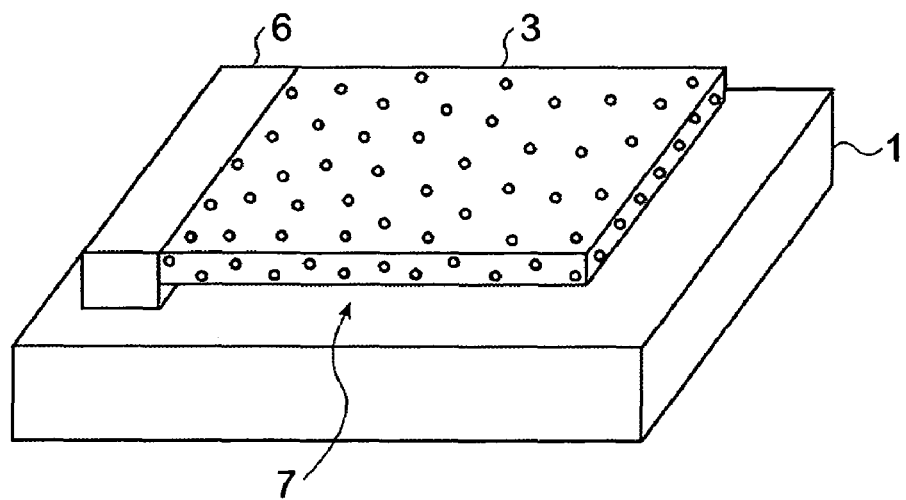
FIG. 3 is a perspective view showing the method of manufacturing a semiconductor device according to the first embodiment of the invention.

Subsequently, as shown in FIG. 3, a part of the silicon oxide film 2 disposed under the non-crystalline semiconductor layer 3 is exposed by patterning the silicon oxide film 2, the non-crystalline semiconductor layer 3 and the silicon oxide film 4 using a photolithography technology and an etching technology. Further, in order for exposing the part of the silicon oxide film 2, the etching can be stopped on the surface of the silicon oxide film 2, or the silicon oxide film 2 can be overetched to form a recess section on the silicon oxide film 2. Or, the surface of the single crystal semiconductor substrate 1 can be exposed through the silicon oxide film 2.

And, the silicon oxide films 2 and 4 are etched to be removed by contacting an etching gas or an etching liquid to form a gap 7 between the single crystal semiconductor substrate 1 and the non-crystalline semiconductor layer 3. Note that wet-etching using fluorinated acid as an etching liquid is preferably used to remove the silicon films 2 and 4 by etching. Here, since the single crystal semiconductor layer 6 is formed in the opening section 5, the non-crystalline semiconductor layer 3 can be supported above the single crystal semiconductor substrate 1 by the single crystal semiconductor layer 6 even after the silicon oxide films 2 and 4 are removed, thus the non-crystalline semiconductor layer 3 can be supported above the single crystal semiconductor substrate 1 with a distance while contacting only the single crystal semiconductor layer 6.

Figure 4:
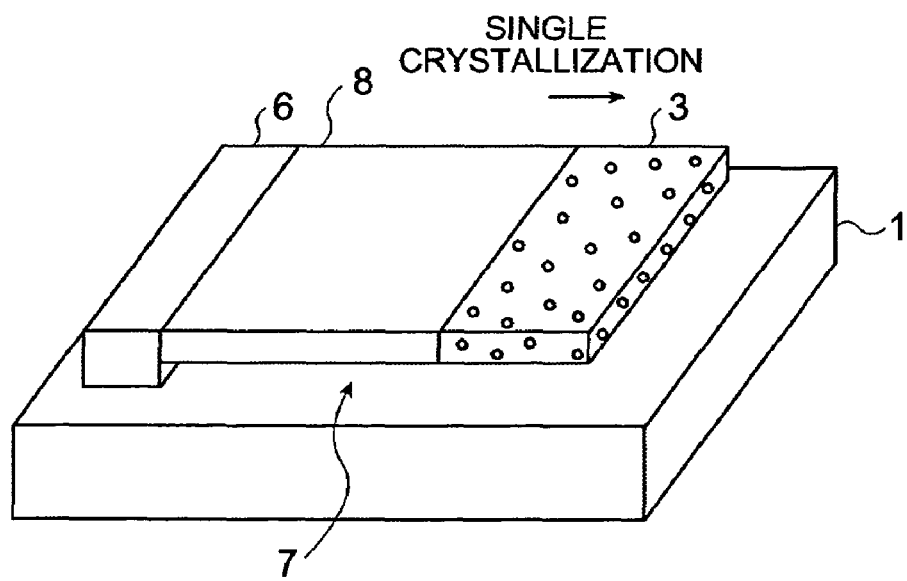
FIG. 4 is a perspective view showing the method of manufacturing a semiconductor device according to the first embodiment of the invention.

Subsequently, as shown in FIG. 4, a single-crystallized semiconductor layer 8 obtained by single-crystallizing the non-crystalline semiconductor layer 3 by providing a thermal treatment on the non-crystalline semiconductor layer 3 using the single crystal semiconductor layer 6 as a seed.

In this case, since the non-crystalline semiconductor layer 3 is supported by the single crystal semiconductor layer 6 above the single crystal semiconductor substrate 1 with a distance, the non-crystalline semiconductor layer 3 can be single-crystallized while the non-crystalline semiconductor layer 3 is prevented from having contact with the silicon oxide film 2. Therefore, the single-crystallized semiconductor layer 8 can be formed while preventing the lateral single crystallization of the non-crystalline semiconductor layer 3 from being constricted by the silicon oxide film 2, thus a large sized single-crystallized semiconductor layer 8 can be obtained while improving the crystal quality of the single-crystallized semiconductor layer 8.

Figure 5:
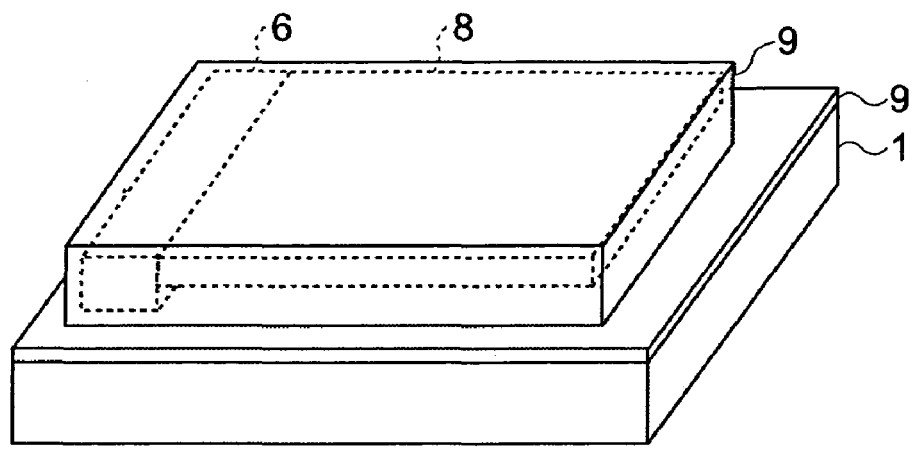
FIG. 5 is a perspective view showing the method of manufacturing a semiconductor device according to the first embodiment of the invention.

Subsequently, as shown in FIG. 5, an embedded insulating layer 9 is formed in the gap 7 between the single crystal semiconductor substrate 1 and the single-crystallized semiconductor layer 8 by executing thermal oxidation of the single crystal semiconductor substrate 1, the single crystal semiconductor layer 6 and the single-crystallized semiconductor layer 8.

Accordingly, the embedded insulating layer 9 can be disposed between the single-crystallized semiconductor layer 8 and the single crystal semiconductor substrate 1, thus the single-crystallized semiconductor layer 8 can be formed on the embedded insulating layer 9 with low cost while improving the crystal quality of the single-crystallized semiconductor layer 8, and at same time, the area of the single-crystallized semiconductor 8 can be enlarged.

Note that a high-temperature annealing treatment at 1000° C. or higher can be executed after forming the embedded insulating layer 9 in the gap 7. Accordingly, the embedded insulating layer 9 can be reflowed, thus the stress of the embedded insulating layer 9 can be eased, and the interface state in the boundary with the single-crystallized semiconductor layer 8 can be decreased. Further, the embedded insulating layer 9 can be formed so as to fill the gap 7 entirely or partially with a part of the gap 7 remaining.

Further, although in the process shown in FIG. 5, there is described the process of forming the embedded insulating layer 9 in the gap 7 provided between the single crystal semiconductor substrate 1 and the single-crystallized semiconductor layer 8 by executing the thermal oxidation process on the single crystal semiconductor substrate 1, the single crystal semiconductor layer 6 and the single-crystallized semiconductor layer 8, the gap 7 provided between the single crystal semiconductor substrate 1 and the single-crystallized semiconductor layer 8 can also be filled with the embedded insulating layer 9 by forming an insulating film in the gap 7 provided between the single crystal semiconductor substrate 1 and the single-crystallized semiconductor layer 8 using a CVD process. Thus, the gap 7 between the single crystal semiconductor substrate 1 and the single-crystallized layer 8 can be filled with another material than the oxide film while preventing film reduction of the single-crystallized semiconductor layer 8. Therefore, the thickness of the embedded insulating layer 9 disposed on the back surface of the single-crystallized semiconductor layer 8 can be increased, and at the same time, the dielectric constant thereof can also be decreased, thus a parasitic capacitance in the back surface of the single-crystallized semiconductor layer 8 can be reduced.

Note that a silicon oxide film, an FSG (Fluorinated Silicate Glass) film or a silicon nitride film, for example, can be used as a material of the embedded insulating layer 9. Further, an SOG (Spin On Glass) film, an organic lowk film such as a PSG film, a BPSG film, a film including PAE (poly (arylene ether)), a film including HSQ (hydrogen silsesquioxane), a film including MSQ (methyl silsesquioxane), a film including PCB, a film including CF, a film including SiOC or a film including SiOF, or a porous film of the above can be used as the embedded insulating layer 9.

Figure 6:
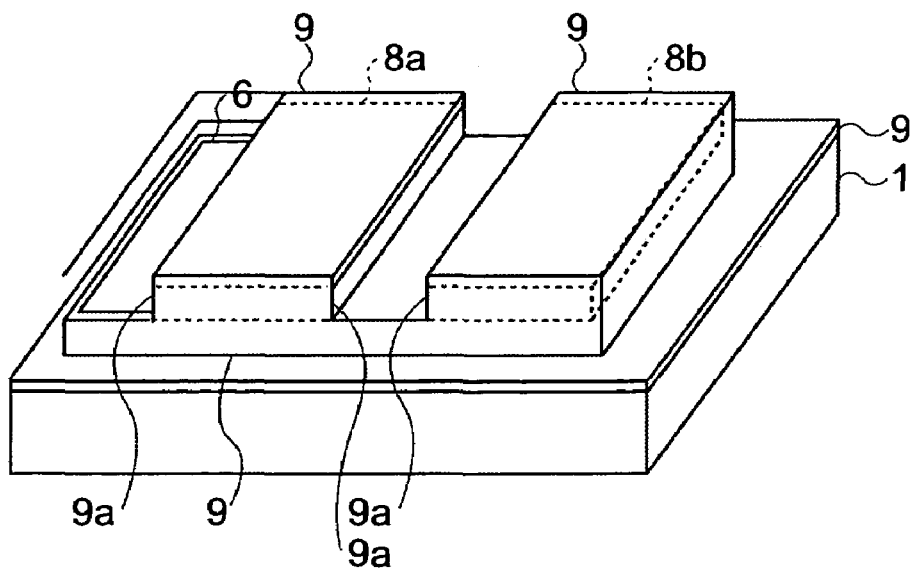
FIG. 6 is a perspective view showing the method of manufacturing a semiconductor device according to the first embodiment of the invention.

Subsequently, as shown in FIG. 6, by patterning the single crystal semiconductor layer 6, the single-crystallized semiconductor layer 8 and the embedded insulating layer 9 using a photolithography technology and an etching technology, grooves 9a for dividing the single-crystallized semiconductor layer 8 into elements are formed to divide the single-crystallized semiconductor layer 8 into single-crystallized semiconductor layers 8a and 8b. Note that, when forming the grooves 9a for dividing the single-crystallized semiconductor layer 8, the grooves 9a can be disposed so as to include the single crystal semiconductor layer 6. Thus, the single-crystallized semiconductor layers 8a and 8b can be separated from the single crystal semiconductor layer 6 while separating the single-crystallized semiconductor layers 8a and 8b disposed on the embedded insulating layer 9 from each other, thereby completely insulating the single-crystallized semiconductor layers 8a and 8b from the single crystal semiconductor substrate 1 while preventing the manufacturing process form becoming complicated.

Figure 7:
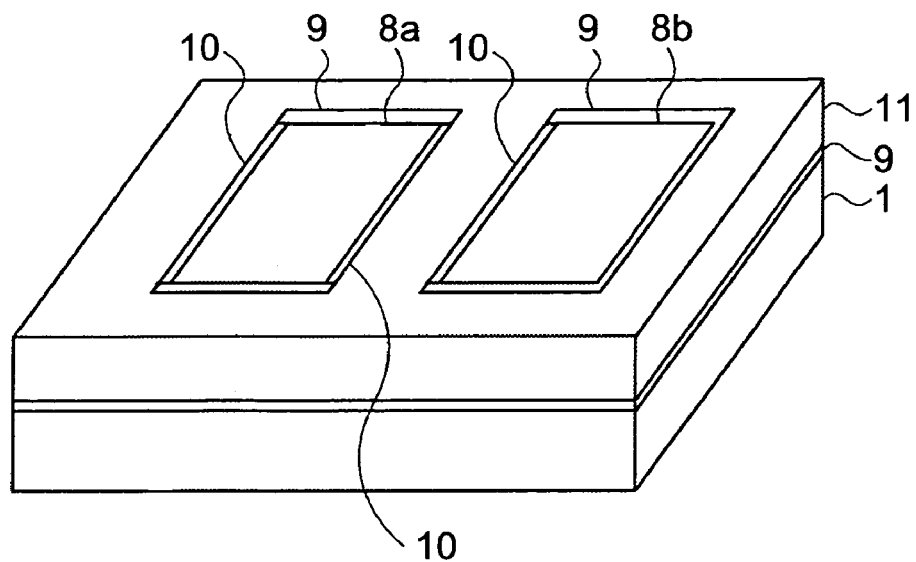
FIG. 7 is a perspective view showing the method of manufacturing a semiconductor device according to the first embodiment of the invention.

Subsequently, as shown in FIG. 7, thermal oxidized films 10 are formed on the side walls of the single-crystallized semiconductor layers 8a and 8b by thermal-oxidizing the single-crystallized semiconductor layers 8a and 8b. And then, a planarizing film 11 is formed on the embedded insulating layer 9 using a CVD process or the like so as to fill in the grooves 9a. And, the planarizing film 11 and the embedded insulating layer 9 are thinned to be thin films by applying a CMP (Chemical Mechanical Polishing) method or an etch-back method in combination with a photolithography technology if necessary, thereby exposing the surfaces of the single-crystallized semiconductor layers 8a and 8b.

Figure 8:
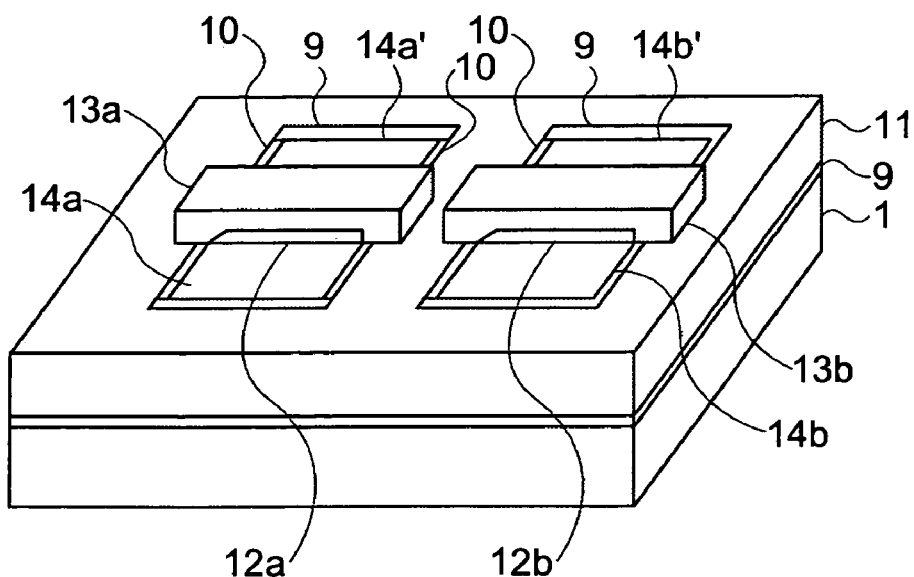
FIG. 8 is a perspective view showing the method of manufacturing a semiconductor device according to the first embodiment of the invention.

Subsequently, as shown in FIG. 8, gate insulating films 12a and 12b are respectively formed on the single-crystallized semiconductor layers 8a and 8b by thermal-oxidizing the surfaces of the single-crystallized semiconductor layers 8a and 8b. And, by a CVD method or the like, polycrystal silicon layers are formed on the single-crystallized semiconductor layers 8a and 8b respectively provided with the gate insulating films 12a and 12b. And then, gate electrodes 13a and 13b are respectively formed on the single-crystallized semiconductor layers 8a and 8b by patterning the polycrystal silicon layers using a photolithography technology and an etching technology.

Subsequently, by ion-implanting impurities such as As, P or B into the single-crystallized semiconductor layers 8a and 8b using each of the gate electrodes 13a and 13b as a mask, source/drain layers 14a and 14a' respectively disposed on the both sides of the gate electrode 13a are formed in the single-crystallized semiconductor layer 8a, and at the same time, source/drain layers 14b and 14b' respectively disposed on the both sides of the gate electrode 13b are formed in the single-crystallized semiconductor layer 8b.

Thus, the single-crystallized semiconductor layer 8 can be formed by the thermal treatment on the non-crystalline semiconductor layer 3 while supporting the non-crystalline semiconductor layer 3 by the single crystal semiconductor layer 6 above the single crystal semiconductor substrate 1 so that the non-crystalline semiconductor layer 3 does not have contact with the silicon oxide film 2. Therefore, the SOI transistor can be formed without using any SOI substrates, and further the single-crystallized semiconductor layer 8 with large area can be obtained while improving the crystal quality of the single-crystallized semiconductor layer 8, thus price-reduction and quality-improvement of the SOI transistor can be achieved.

Note that, although in the embodiment described above, there is described the method of stacking the single-crystallized semiconductor layer 8 of a single layer on the single crystal semiconductor substrate 1 via the embedded insulating layer 9, it can be arranged that a number of semiconductor layers are stacked on the single crystal semiconductor substrate 1 via respective insulating layers.

Further, although in the embodiment described above, the method of supporting an end of the non-crystalline semiconductor layer 3 by the single crystal semiconductor layer 6 above the single crystal semiconductor substrate 1 is described, it can be arranged that the both ends of the non-crystalline semiconductor layer 3 are supported by single crystal semiconductor layers above the single crystal semiconductor substrate 1. In this case, single crystallization proceeds from the both ends of the non-crystalline semiconductor layer 3 resulting in unconformity of single crystallization in the boundary surface. Therefore, it is preferable that the element separation region is disposed around the boundary surface of the single-crystallized layer to prevent the element area from being disposed around the surface of unconformity of single crystallization.

Figure 9:
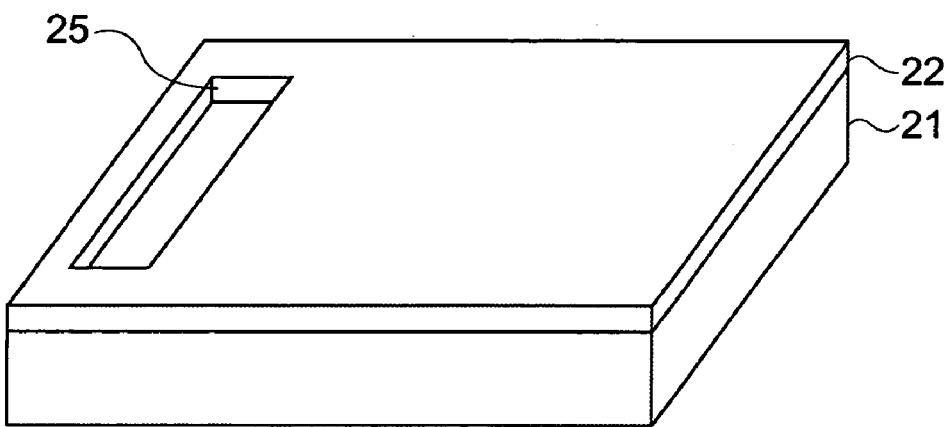
FIG. 9 is a perspective view showing a method of manufacturing a semiconductor device according to a second embodiment of the invention.

FIGS. 9 through 12 are perspective views showing the method of manufacturing a semiconductor device according to a second embodiment of the invention. In FIG. 9, a silicon oxide film 22 is formed on a single crystal semiconductor substrate 21 by a CVD method or the like. And then, an opening section 25 for exposing a part of a surface of the single crystal semiconductor substrate 21 through the silicon oxide film 22 is formed by patterning the silicon oxide film 22 using a photolithography technology and an etching technology.

Figure 10:
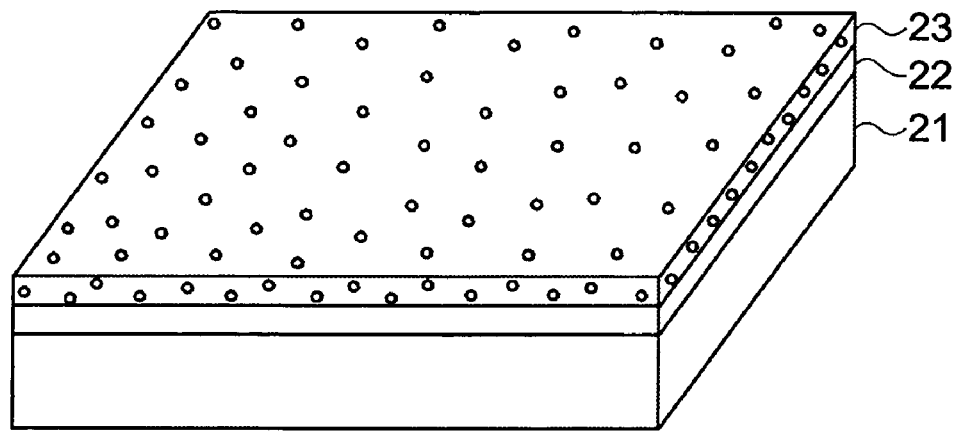
FIG. 10 is a perspective view showing the method of manufacturing a semiconductor device according to the second embodiment of the invention.

Subsequently, as shown in FIG. 10, a non-crystalline semiconductor layer 23 disposed so as to have contact with the single crystal semiconductor substrate 21 via the opening section 25 is formed on the silicon oxide film 22 by a CVD method or the like. Note that an amorphous semiconductor layer can be used as the non-crystalline semiconductor layer 23.

Figure 11:
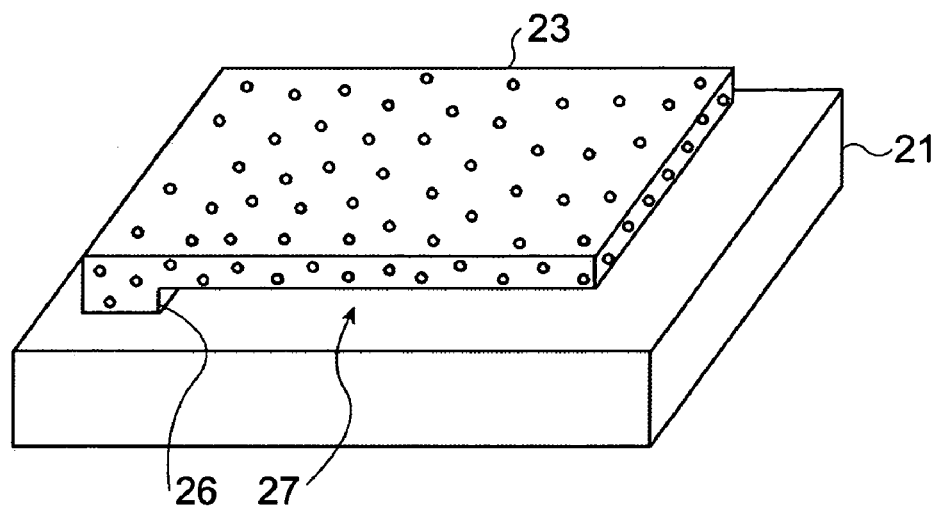
FIG. 11 is a perspective view showing the method of manufacturing a semiconductor device according to the second embodiment of the invention.

Subsequently, as shown in FIG. 11, a part of the silicon oxide film 22 disposed under the non-crystalline semiconductor layer 23 is exposed by patterning the silicon oxide film 22 and the non-crystalline semiconductor layer 23 using a photolithography technology and an etching technology. And then, the silicon oxide films 22 is etched to be removed by contacting an etching gas or an etching liquid to form a gap 27 between the single crystal semiconductor substrate 21 and the non-crystalline semiconductor layer 23. In this case, a support section 26 for supporting the non-crystalline semiconductor layer 23 above the single crystal semiconductor substrate 21 can be formed by forming the non-crystalline semiconductor layer 23 on the silicon oxide film 22 so as to fill in the opening section 25. Therefore, even after the silicon oxide film 22 is removed, the non-crystalline semiconductor layer 23 can be supported by the supporting section 26 above the single crystal semiconductor substrate 21, thus the non-crystalline semiconductor layer 23 can be held above the single crystal semiconductor substrate 21 with a distance while the non-crystalline semiconductor layer 23 has contact only with the single crystal semiconductor substrate 21.

Figure 12:
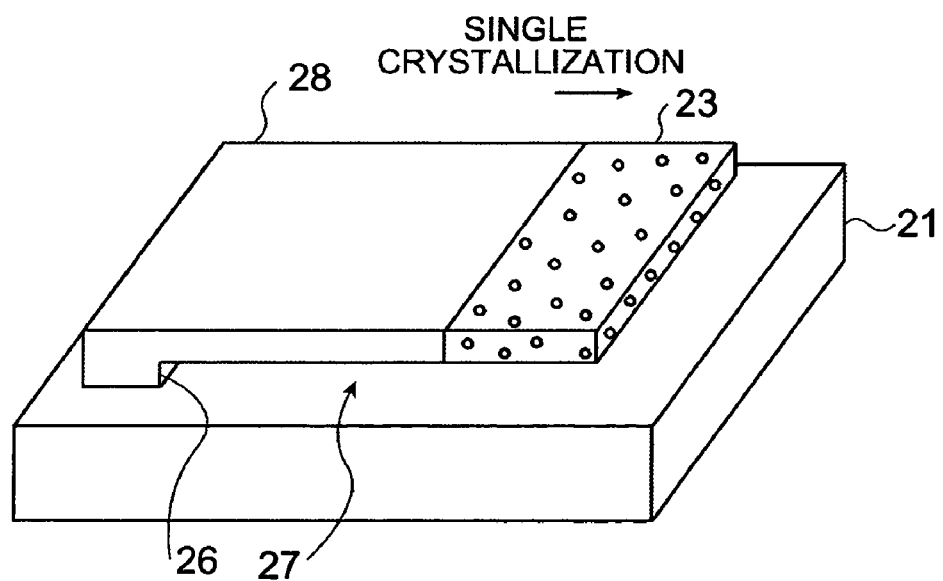
FIG. 12 is a perspective view showing the method of manufacturing a semiconductor device according to the second embodiment of the invention.

Subsequently, as shown in FIG. 12, a single-crystallized semiconductor layer 28 is obtained by single-crystallizing the non-crystalline semiconductor layer 23 by providing a thermal treatment on the non-crystalline semiconductor layer 23 using the single crystal semiconductor substrate 21 as a seed.

In this case, since the non-crystalline semiconductor layer 23 is supported by the supporting section 26 above the single crystal semiconductor substrate 21 with a distance, the non-crystalline semiconductor layer 23 can be single-crystallized while the non-crystalline semiconductor layer 23 is prevented from having contact with the silicon oxide film 22. Therefore, the single-crystallized semiconductor layer 28 can be formed while preventing the lateral single crystallization of the non-crystalline semiconductor layer 23 from being constricted by the silicon oxide film 22, thus a large sized single-crystallized semiconductor layer 28 can be obtained while improving the crystal quality of the single-crystallized semiconductor layer 28.

Subsequently, by going through the same process as shown in FIGS. 5 through 8, the embedded insulating layer can be formed under the single-crystallized semiconductor layer 28, thus a device such as a transistor can be formed using the single-crystallized semiconductor layer 28.

Thus, the single-crystallized semiconductor layer 28 can be formed by the thermal treatment on the non-crystalline semiconductor layer 23 while supporting the non-crystalline semiconductor layer 23 by the non-crystalline semiconductor layer 23 itself above the single crystal semiconductor substrate 21 so that the non-crystalline semiconductor layer 23 does not have contact with the silicon oxide film 22. Therefore, the SOI transistor can be formed without using any SOI substrates, and further the single-crystallized semiconductor layer 28 with large area can be obtained without using the selective epitaxial growth, thus price-reduction and quality-improvement of the SOI transistor can be achieved.

FIGS. 13 through 18 are perspective views showing the method of manufacturing a semiconductor device according to a third embodiment of the invention.

Figure 13:
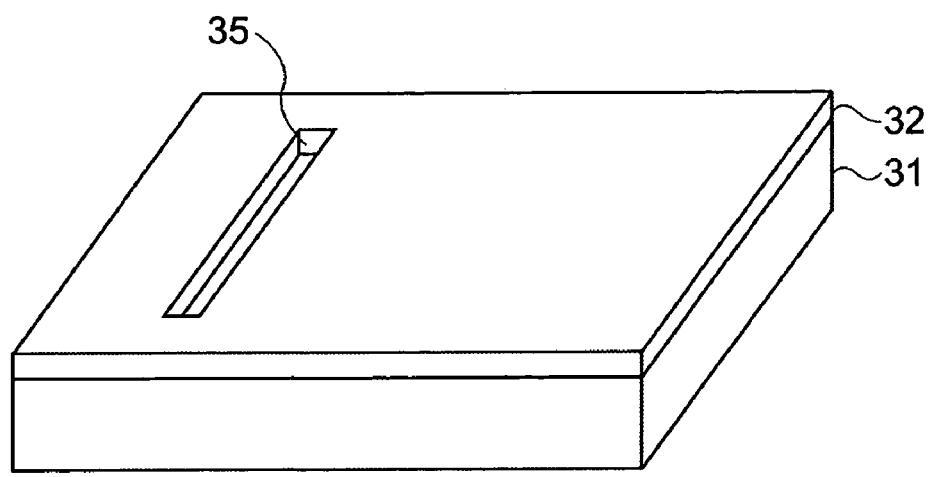
FIG. 13 is a perspective view showing a method of manufacturing a semiconductor device according to a third embodiment of the invention.

In FIG. 13, a silicon oxide film 32 is formed on a single crystal semiconductor substrate 31 by a CVD method or the like. And then, an opening section 35 for exposing a part of a surface of the single crystal semiconductor substrate 31 through the silicon oxide film 32 is formed by patterning the silicon oxide film 32 using a photolithography technology and an etching technology.

Figure 14:
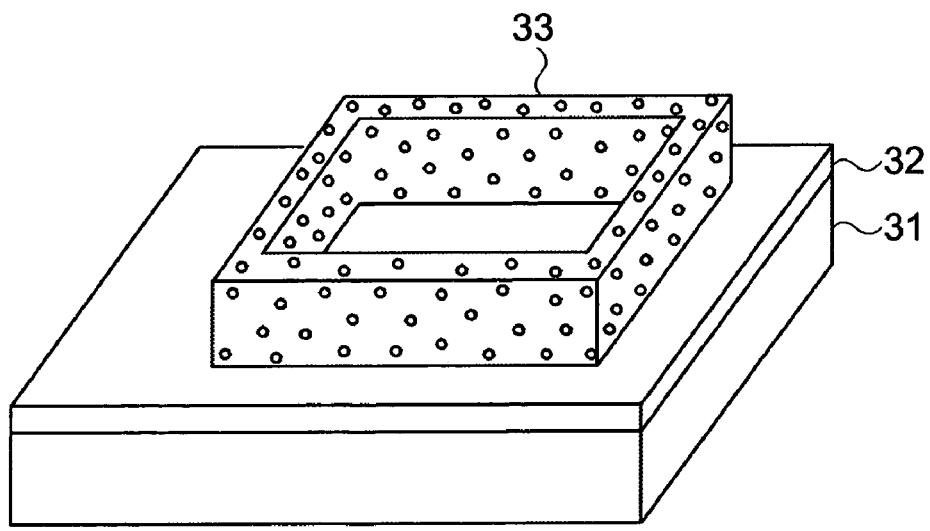
FIG. 14 is a perspective view showing the method of manufacturing a semiconductor device according to the third embodiment of the invention.

Subsequently, as shown in FIG. 14, an non-crystalline semiconductor layer 33 disposed so as to have contact with the single crystal semiconductor substrate 31 via the opening section 35 is formed on the silicon oxide film 32 by a CVD method or the like. Note that an amorphous semiconductor layer can be used as the non-crystalline semiconductor layer 33. And then, side walls of the non-crystalline semiconductor layer 33 are exposed by patterning the non-crystalline semiconductor layer 33 using a photolithography technology and an etching technology. Note that, when exposing the side walls of the non-crystalline semiconductor layer 33, the non-crystalline semiconductor layer 33 can be patterned to have, for example, a protruded shape, a fin-like shape, a box-like shape or a net-like shape.

Figure 15:
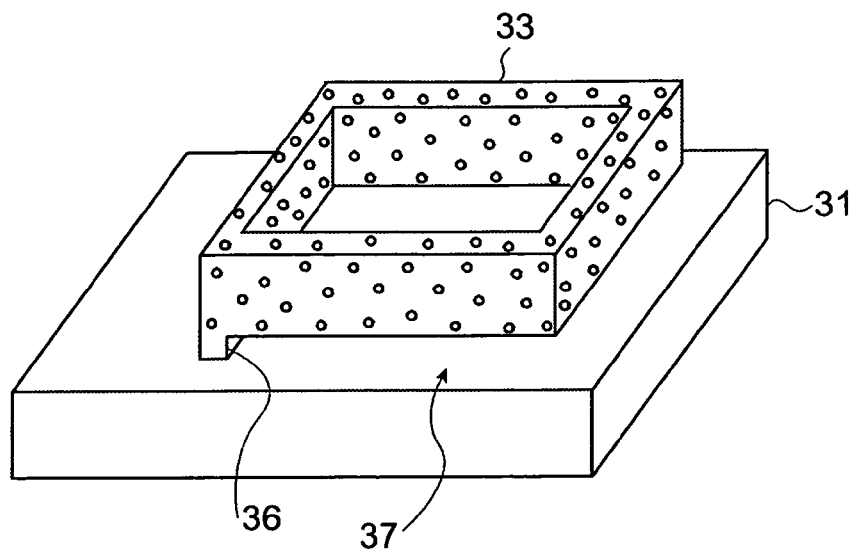
FIG. 15 is a perspective view showing the method of manufacturing a semiconductor device according to the third embodiment of the invention.

Subsequently, as shown in FIG. 15, the silicon oxide films 32 is etched to be removed by contacting an etching gas or an etching liquid to form a gap 37 between the single crystal semiconductor substrate 31 and the non-crystalline semiconductor layer 33. In this case, a support section 36 for supporting the non-crystalline semiconductor layer 33 above the single crystal semiconductor substrate 31 can be formed by forming the non-crystalline semiconductor layer 33 on the silicon oxide film 32 so as to fill in the opening section 35. Therefore, even after the silicon oxide film 32 is removed, the non-crystalline semiconductor layer 33 can be supported by the supporting section 36 above the single crystal semiconductor substrate 31, thus the non-crystalline semiconductor layer 33 can be held above the single crystal semiconductor substrate 31 with a distance while the non-crystalline semiconductor layer 33 has contact only with the single crystal semiconductor substrate 31.

Figure 16:
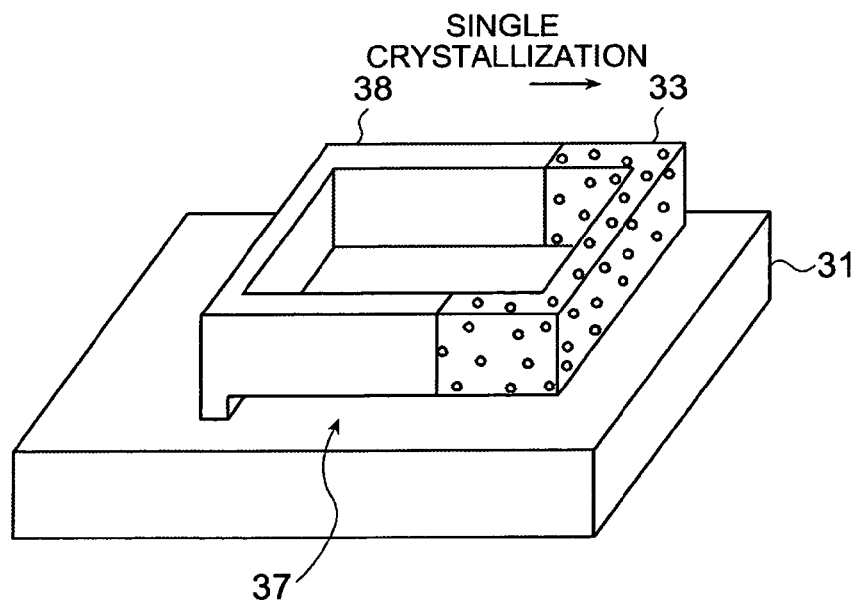
FIG. 16 is a perspective view showing the method of manufacturing a semiconductor device according to the third embodiment of the invention.

Subsequently, as shown in FIG. 16, a single-crystallized semiconductor layer 38 is obtained by single-crystallizing the non-crystalline semiconductor layer 33 by providing a thermal treatment on the non-crystalline semiconductor layer 33 using the single crystal semiconductor substrate 31 as a seed.

In this case, since the non-crystalline semiconductor layer 33 is supported by the supporting section 36 above the single crystal semiconductor substrate 31 with a distance, even in the case in which the non-crystalline semiconductor layer 33 is patterned so as to expose its side walls, the non-crystalline semiconductor layer 33 can be single-crystallized while the non-crystalline semiconductor layer 33 is prevented from having contact with the silicon oxide film 32. Therefore, the single-crystallized semiconductor layer 38 can be formed while preventing the lateral single crystallization of the non-crystalline semiconductor layer 33 from being constricted by the silicon oxide film 32, thus a large sized single-crystallized semiconductor layer 38 can be obtained while improving the crystal quality of the single-crystallized semiconductor layer 38, and further, the single-crystallized semiconductor layer 38 having a various shapes can be obtained.

Figure 17:
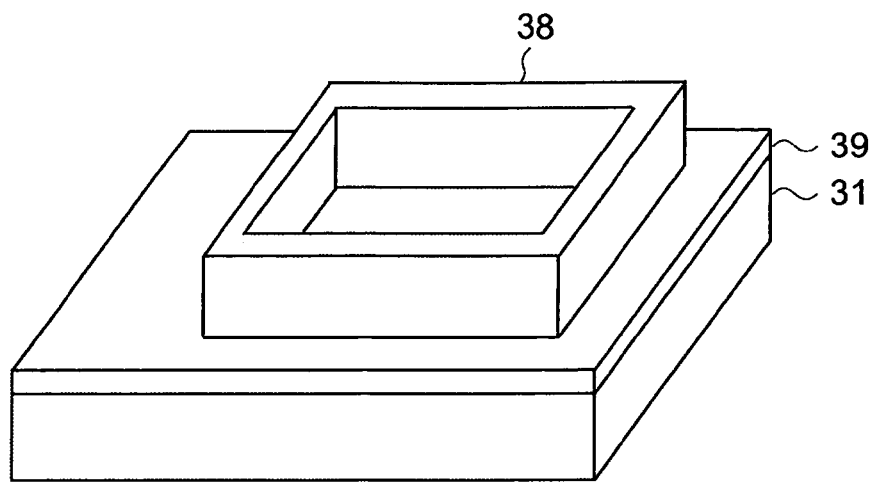
FIG. 17 is a perspective view showing the method of manufacturing a semiconductor device according to the third embodiment of the invention.

Subsequently, as shown in FIG. 17, an embedded insulating layer 39 is deposited on the entire surface of the single crystal semiconductor substrate 31 so as to fill in the gap 37 under the single-crystallized semiconductor layer 38 by a CVD method, a spin coat method or the like. And then, the side walls of the single-crystallized semiconductor layer 38 are exposed while the embedded insulating layer 39 remains on the single crystal semiconductor substrate 31 by etching the embedded insulating layer 39 in combination with a photolithography technology if necessary.

Figure 18:
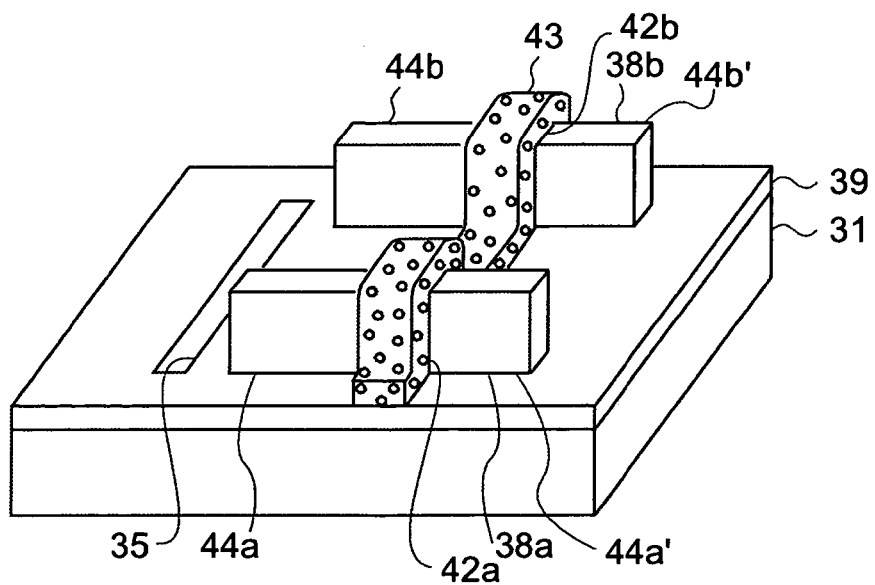
FIG. 18 is a perspective view showing the method of manufacturing a semiconductor device according to the third embodiment of the invention.

Subsequently, as shown in FIG. 18, the single-crystallized semiconductor layer 38 is divided into single-crystallized semiconductor layers 38a and 38b, and at the same time, the single-crystallized semiconductor layer 38 embedded in the opening section 35 is separated from the single-crystallized semiconductor layers 38a and 38b by patterning the single-crystallized semiconductor layer 38 using a photolithography technology and an etching technology. And then, gate insulating films 42a and 42b are formed respectively on the side walls of the single-crystallized semiconductor layers 38a and 38b by conducting thermal oxidation of the side walls of the single-crystallized semiconductor layers 38a and 38b. And, by a CVD method or the like, a polycrystal silicon layer is formed so as to cover the single-crystallized semiconductor layers 38a and 38b respectively provided with the gate insulating films 42a and 42b. And then, gate electrode 43 disposed so as to traverse both of the single-crystallized semiconductor layers 38a and 38b is formed by patterning the polycrystal silicon layer using a photolithography technology and an etching technology.

Subsequently, by ion-implanting impurities such as As, P or B into the single-crystallized semiconductor layers 38a and 38b using the gate electrode 43 as a mask, source/drain layers 44a and 44a' respectively disposed on the both sides of the gate electrode 43 are formed in the single-crystallized semiconductor layer 38a, and at the same time, source/drain layers 44b and 44b' respectively disposed on the both sides of the gate electrode 43 are formed in the single-crystallized semiconductor layer 38b.

Thus, the single-crystallized semiconductor layer 38 with various shapes can be formed by the thermal treatment on the non-crystalline semiconductor layer 33 while holding the non-crystalline semiconductor layer 33 above the single crystal semiconductor substrate 31 so that the non-crystalline semiconductor layer 33 does not have contact with the silicon oxide film 32, and further, the selective epitaxial growth for forming the seed crystal can be eliminated, thus simplification of the manufacturing process can be achieved. Therefore, the SOI transistor can be formed without using the SOI substrate, and the drive capacity of the SOI transistor can be increased without increasing the element size, thus high-density integration of the SOI transistor can be realized while achieving price-reduction and quality-improvement of the SOI transistor.

Note that, although the method of single-crystallizing the non-crystalline semiconductor layer 33 using the single crystal semiconductor substrate 31 as the seed crystal is explained in the third embodiment described above, the seed crystal for single-crystallizing the non-crystalline semiconductor layer 33 can be formed by the selective epitaxial growth.

The entire disclosure of Japanese Patent Application No. 2005-094368, filed Mar. 29, 2005 is expressly incorporated by reference herein.

What is claimed is:

1. A method of manufacturing a semiconductor device, comprising:

forming an insulating layer on a single crystal semiconductor substrate;

forming a non-crystalline semiconductor layer on the insulating layer;

forming an insulating film on the non-crystalline semiconductor layer;

forming an opening section for exposing a part of a surface of the single crystal semiconductor substrate through the insulating film, the non-crystalline semiconductor layer and the insulating layer;

forming a single crystal semiconductor layer embedded in the opening section so as to have contact with the non-crystalline semiconductor layer;

removing the insulating film and the insulating layer while the single crystal semiconductor layer supporting the non-crystalline semiconductor layer above the single crystal semiconductor substrate;

forming a single-crystallized semiconductor layer obtained by single-crystallizing the non-crystalline semiconductor layer using the single crystal semiconductor layer as a seed by providing a thermal treatment on the non-crystalline semiconductor layer from which the insulating film and the insulating layer are removed;

filling a gap between the single-crystallized semiconductor layer and the single crystal semiconductor substrate with an embedded insulating layer;

forming a gate electrode on the single-crystallized semiconductor layer; and forming in the single-crystallized semiconductor layer a source layer disposed on one side of the gate electrode and a drain layer disposed on the other side of the gate electrode.

2. The method of manufacturing a semiconductor device according to claim 1, further comprising:

forming in the single-crystallized semiconductor layer a groove disposed so as to include the opening section; and filling the groove with an insulating member.

3. A method of manufacturing a semiconductor device, comprising:

forming an insulating layer on a single crystal semiconductor substrate;

forming an opening section for exposing a part of a surface of the single crystal semiconductor substrate through the insulating layer;

forming on the insulating layer a non-crystalline semiconductor layer disposed so as to have contact with the single crystal semiconductor substrate via the opening section;

removing the insulating layer while a part of the non-crystalline semiconductor layer embedded in the opening section supporting a part of the non-crystalline semiconductor layer disposed on the insulating layer above the single crystal semiconductor substrate;

forming a single-crystallized semiconductor layer obtained by single-crystallizing the non-crystalline semiconductor layer using the single crystal semiconductor substrate as a seed by providing a thermal treatment on the non-crystalline semiconductor layer from which the insulating layer is removed;

filling a gap between the single-crystallized semiconductor layer and the single crystal semiconductor substrate with an embedded insulating layer;

forming a gate electrode on the single-crystallized semiconductor layer; and forming in the single-crystallized semiconductor layer a source layer disposed on one side of the gate electrode and a drain layer disposed on the other side of the gate electrode.

4. A method of manufacturing a semiconductor device, comprising:

forming an insulating layer on a single crystal semiconductor substrate;

forming a non-crystalline semiconductor layer on the insulating layer;

patterning the non-crystalline semiconductor layer so that the non-crystalline semiconductor layer has a fin-like shape;

forming an insulating film on the non-crystalline semiconductor layer patterned to have the fin-like shape;

forming an opening section for exposing a part of a surface of the single crystal semiconductor substrate through the insulating film, the non-crystalline semiconductor layer and the insulating layer;

forming a single crystal semiconductor layer embedded in the opening section so as to have contact with the non-crystalline semiconductor layer;

removing the insulating film and the insulating layer while the single crystal semiconductor layer supporting the non-crystalline semiconductor layer above the single crystal semiconductor substrate;

forming a single-crystallized semiconductor layer obtained by single-crystallizing the non-crystalline semiconductor layer using the single crystal semiconductor layer as a seed by providing a thermal treatment on the non-crystalline semiconductor layer from which the insulating film and the insulating layer are removed;

filling a gap between the single-crystallized semiconductor layer and the single crystal semiconductor substrate with an embedded insulating layer;

forming a gate electrode on a side wall of the single-crystallized semiconductor layer; and forming in the single-crystallized semiconductor layer a source layer disposed on one side of the gate electrode and a drain layer disposed on the other side of the gate electrode.

* * * * *